(12) United States Patent
Yang et al.

(10) Patent No.: US 8,032,812 B1
(45) Date of Patent: Oct. 4, 2011

(54) ERROR CORRECTION DECODING METHODS AND APPARATUS

(75) Inventors: Xueshi Yang, Sunnyvale, CA (US); Zining Wu, Los Altos, CA (US); Heng Tang, Sunnyvale, CA (US)

(73) Assignee: Marvell World Trade Ltd., St. Michael (BB)

( * ) Notice: Subject to any disclaimer, the term of this patent is extended or adjusted under 35 U.S.C. 154(b) by 1017 days.

(21) Appl. No.: 11/867,356

(22) Filed: Oct. 4, 2007

Related U.S. Application Data

(60) Provisional application No. 60/828,147, filed on Oct. 4, 2006.

(51) Int. Cl.
*H03M 13/00* (2006.01)
(52) U.S. Cl. ........................ 714/755; 714/758
(58) Field of Classification Search .............. 341/58; 714/760, 780, 762, 755, 758, 784
See application file for complete search history.

(56) References Cited

U.S. PATENT DOCUMENTS

| | | | |
|---|---|---|---|
| 5,712,861 A | | 1/1998 | Inoue et al. |
| 5,942,005 A | * | 8/1999 | Hassner et al. ............ 714/784 |
| 6,018,304 A | * | 1/2000 | Bessios ..................... 341/58 |
| 6,240,538 B1 | * | 5/2001 | Dent et al. ................ 714/762 |
| 6,457,156 B1 | | 9/2002 | Stenfort |
| 6,694,477 B1 | * | 2/2004 | Lee ........................... 714/784 |
| 7,203,895 B2 | * | 4/2007 | Lee ........................... 714/780 |
| 7,370,258 B2 | * | 5/2008 | Iancu et al. ............... 714/755 |
| 7,634,706 B1 | * | 12/2009 | Chen et al. ............... 714/760 |

FOREIGN PATENT DOCUMENTS

EP 1028534 8/2002

OTHER PUBLICATIONS

Toumpakaris, D., et al.: "A byte-erasure method for improved impulse immunity in DSL systems using soft information from an inner code"; ICC 2003; 2003 IEEE International Conference on Communications; Anchorage, AK; May 11-15, 2003; vol. 1 of 5, May 11, 2003, pp. 2431-2435.
The International Search Report and the Written Opinion of the International Searching Authority, or the Declaration dated May 6, 2008 for the International Application No. PCT/US2007/021333 filed on Oct. 4, 2007; 13 pages.

* cited by examiner

*Primary Examiner* — David Ton

(57) ABSTRACT

A method and system for error correction decoding uses concatenated error correction decoders. A channel decoder receives encoded user data from a transmission channel, decodes the bits of the user data, and generates erasure information for the decoded bits. The decoded bits and erasure information is received by an outer ECC decoder, which first performs erasure decoding. If the erasure decoding is successful, then the decoded user data is output. If the erasure decoding is not successful, then the outer ECC decoder performs the more complex error decoding. Thus, error decoding need not be performed for user data that can be successfully decoded using erasure decoding. The extra operations required to perform error decoding is avoided. In this manner, the complexity of the overall decoding process is reduced, significantly reducing the computation power required, while maintaining the desired performance level.

16 Claims, 4 Drawing Sheets

ERROR CORRECTION DECODING METHODS AND APPARATUS

CROSS-REFERENCE TO RELATED APPLICATIONS

This application claims the benefit of provisional Patent Application Ser. No. 60/828,147, filed Oct. 4, 2006, assigned to the assignee of the present application, and incorporated herein by reference in its entirety.

BACKGROUND

Error-correction coding, also called channel coding, is a type of digital signal processing that improves data reliability by introducing a known structure into a data sequence prior to transmission or storage. This structure enables a receiving system to detect and possibly correct errors caused by corruption during transmission or storage. This coding technique enables the decoder to correct errors without requesting retransmission of the original information or retrieving corrupt information from storage.

FIG. 1 is a block diagram illustrating an exemplary communication system. In communication channels that employ error-correction coding, a digital information source sends user data to an encoder 101. The encoder 101 inserts redundant bits, or parity bits, thereby outputting a longer sequence of code bits called a codeword. The codeword is sent through the transmission channel 102, where errors could occur due to noise or other factors. The codewords are received by a decoder 103, which extracts the original or recovered user data.

For many algebraic error correction codes, such as Reed-Solomon codes and BCH (Bose, Ray-Chaudhuri, Hocquenghem) codes, the complexity of the decoding scheme is determined by the desired error correction power and field size. Known communication systems use either erasure decoding or error decoding. When the locations of the errors are known, erasure decoding is used. For example, when a receiver detects the presence of jamming, fading, or some transient malfunction, it may choose to declare a bit or symbol erased. Attempts to correct the erasures can then be performed using the error correction codes and the erasure information. Here, the decoder receives erasure information, which indicates the location of zero or more suspected corrupt symbols within a codeword. Otherwise, error decoding is used. In error decoding, the decoder attempts to correct the errors by finding both the locations of the errors and by recovering the original symbols using the error correction codes. Reed-Solomon and BCH codes, as well as erasure and error decoding, are well known in the art and will not be described here in detail. Erasure decoding requires fewer operations than error decoding but requires erasure information, which is not always available. Error decoding does not require erasure information, however, in general, it is more complex, requiring more operations than erasure decoding.

Accordingly, there is a need for a method and system for reducing the complexity of error correction decoding while maintaining a desired error correction performance level.

BRIEF SUMMARY

A method and system for error correction decoding uses concatenated error correction decoders. A channel decoder receives encoded user data from a transmission channel, decodes the bits of the user data, and generates erasure information for the decoded bits. The decoded bits and erasure information is received by an outer ECC decoder, which first performs erasure decoding. If the erasure decoding is successful, then the decoded user data is output. If the erasure decoding is not successful, then the outer ECC decoder performs the more complex but more powerful error decoding. Thus, error decoding need not be performed for user data that can be successfully decoded using erasure decoding. The extra operations required to perform error decoding is avoided. In this manner, the complexity of the overall decoding process is reduced, significantly reducing the computation power required, while maintaining the desired performance level.

DETAILED DESCRIPTION

The present invention is related to reducing the complexity of error correction decoding while maintaining a desired accuracy level through the use of concatenated error correction decoders. The following description is presented to enable one of ordinary skill in the art to make and use the invention and is provided in the context of a patent application and its requirements. Various modifications to the exemplary embodiments and the generic principles and features described herein will be readily apparent to those skilled in the art. Thus, the invention is not intended to be limited to the embodiments shown, but is to be accorded the widest scope consistent with the principles and features described herein.

Figure 1:
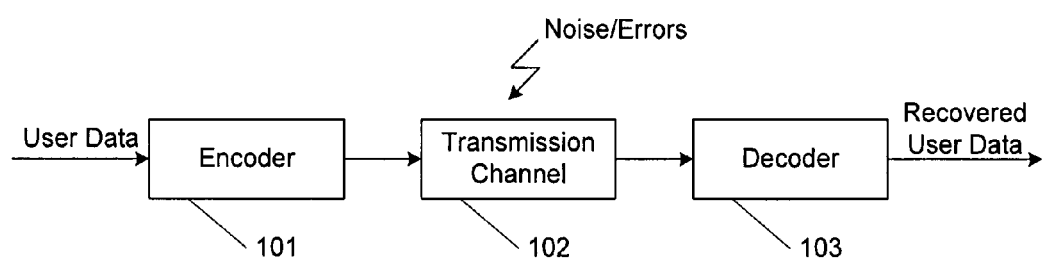
FIG. 1 is a block diagram illustrating an exemplary communication system.
Figure 2:
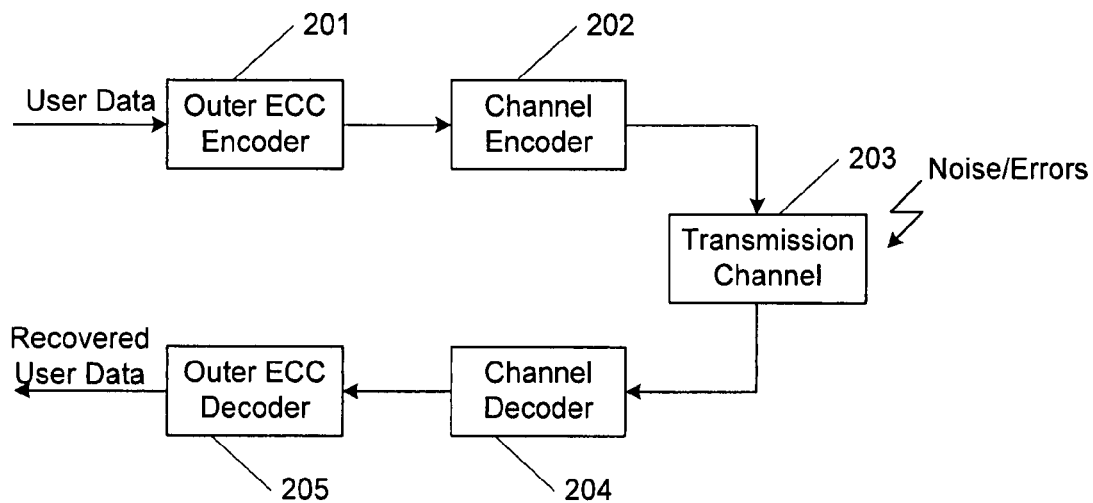
FIG. 2 is a block diagram illustrating an exemplary embodiment of a communication channel with concatenated error correction decoders.

FIG. 2 is a block diagram illustrating an exemplary embodiment of a communication channel with concatenated error correction decoders. User data is first encoded by an outer error correction code (ECC) encoder 201, and then by a channel encoder 202 using a known error correction encoding method, such as Reed-Solomon code, BCH code, or other types of algebraic or convolutional coding. The encoded data are then modulated and transmitted through the transmission channel 203. The transmission channel may be susceptible to noise which produces errors in the encoded user data.

During receipt of the encoded user data, the decoding operation is carried out in the opposite sequence, where the encoded data are first decoded by a channel decoder 204, followed by an outer ECC decoder 205. The outer ECC decoder 205 corrects any remaining errors after the channel decoding.

Figure 3:
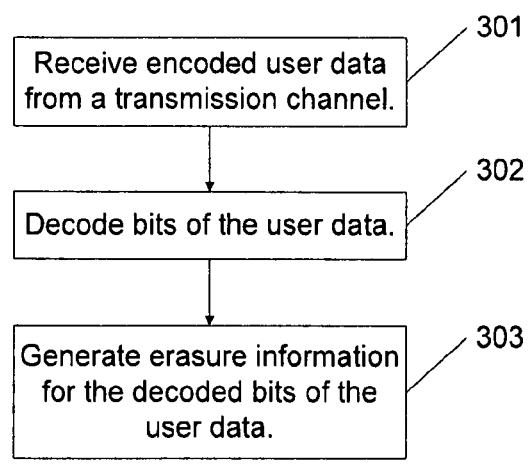
FIG. 3 is a flowchart illustrating an exemplary embodiment of the channel decoding.

FIG. 3 is a flowchart illustrating an exemplary embodiment of the channel decoding. The channel decoder 204 first receives encoded user data from a transmission channel 203 (step 301). The channel decoder 204 decodes the bits of the user data (step 302), and generates erasure information for the decoded bits of the user data (step 303).

In the exemplary embodiment, the channel decoder 204 generates erasure information for each decoded bit according to either a "hard decoding" or a "soft decoding" scheme. In hard decoding, the channel decoder 204 operates on each binary bit, and sets an erasure flag corresponding to the bit if the codeword to which the bit belongs fails the decoding. In soft decoding, the channel decoder 204 operates on reliability or soft information of the binary bits, and sets the erasure flag if the codeword to which the bit belongs fails the decoding. Alternatively, the channel decoder 204 sets the erasure flag for the bits which after decoding have reliability value below a predetermined threshold. "Reliability information", as used in this specification, refers to a value indicating the confidence level of a bit being 0 or 1. For example, if a bit can be "1" with probability p1, and "0" with probability p0, a common measure for soft information will be $$\log \frac{P1}{P0},$$

the value of which can range from −∞ to +∞].

Figures 4, 5:
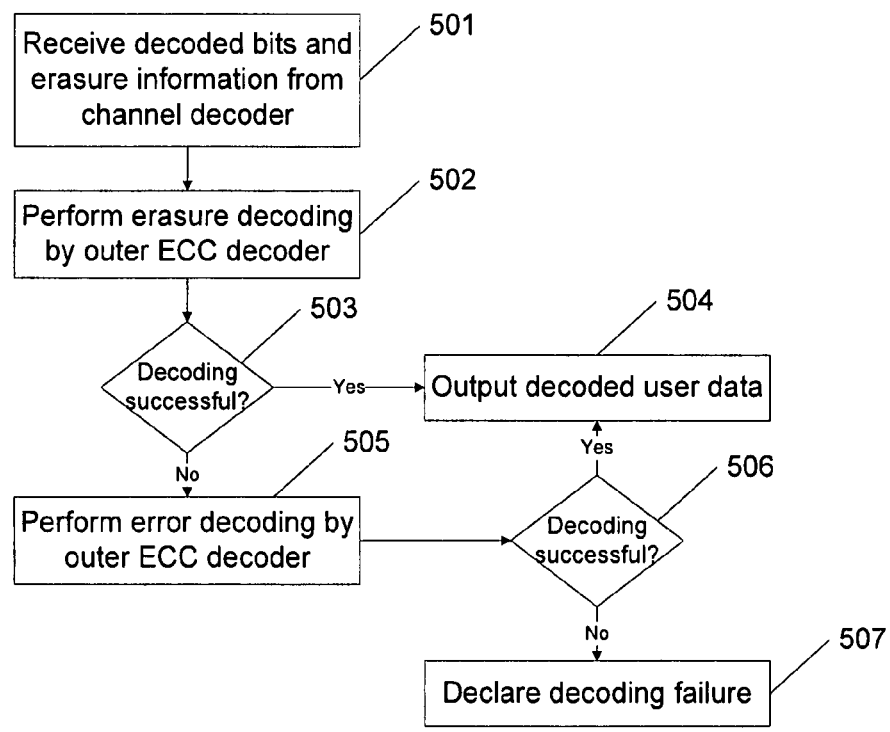
FIG. 4 illustrates an example channel decoder output.
FIG. 5 is a flowchart illustrating an exemplary embodiment of the outer ECC decoding.

FIG. 4 illustrates an example channel decoder output. The encoded user data is decoded into the decoded bits 401 by the channel decoder 204. If the decoding of a bit fails, the channel decoder 204 sets its corresponding erasure flag 402 to '1'. If the decoding of the bit is successful, then the channel decoder 204 sets its corresponding erasure flag 402 to '0'. In FIG. 4, the values of the decoded bits 401 are illustrated in the top row of '0' and '1'. Their corresponding erasure flags 402 are represented in the bottom row of '0' and '1'. Here, the decoding of bits 0-7 and 23-30 was unsuccessful. Thus, their corresponding erasure flags have been set to '1'. The erasure flags for the remaining bits have been set to '0'. In an alternative exemplary embodiment, the erasure information can be simplified by assigning one erasure flag to a group of channel bits without significantly changing the operations. Thus, for the example in FIG. 4, a single erasure flag would correspond to decoded bits 0-7.

FIG. 5 is a flowchart illustrating an exemplary embodiment of the outer ECC decoding. First, the outer ECC decoder 205 receives both the decoded bits and the associated erasure information from the channel decoder 204 (step 501) and performs further decoding. The outer ECC decoder 205 first performs erasure decoding (step 502) on the decoded bits using the erasure information, i.e., assumes that the error locations were known to the channel decoder 204. If the outer ECC decoder 205 determines that the erasure decoding is successful (step 503), then it outputs the decoded user data (step 504).

For pure erasure decoding, i.e., without any error correction capability except the erased positions, decoding failure/success can be determined as follows:

If t is the error correcting capability of a code, then the erasure correction capability is 2t. So the outer ECC decoder 205 must take 2t erased positions. If the channel code marks less than 2t erasures (such as e erasures), then the outer ECC decoder 205 must add 2t−e artificial erasures to perform the decoding.

There are three possible methods to detect an erasure decoding failure:

1. Set a cap on the maximum number of erasures allowed: e_max<=2t. If the number of erasures is more than this number, then the out ECC decoder 205 declares failure. The number e_max may be chosen to be smaller than or equal to the capability 2t.

2. If the number of marked erasures is e<2t, then the outer ECC decoder 205 must add 2t−e erasures to have 2t erasures to perform erasure decoding. If any of these added 2t−e positions are modified by erasure decoding, then the outer ECC decoder 205 declares failure (since these positions are "fake" erasures and should not be modified).

3. After the ECC erasure decoding, the outer ECC decoder 205 checks if the decoded data form valid code words of the inner channel codes. If any of them are invalid, then the outer ECC decoder 205 declares failure.

If the outer ECC decoder 205 determines that the erasure decoding is not successful, the outer ECC decoder 205 performs error decoding (step 505), where the erasure information from the channel decoder 204 is ignored. In other words, the outer ECC decoder 205 assumes no knowledge of the error locations. If the outer ECC decoder 205 determines that the error decoding is successful (step 506), then it outputs the decoded user data (step 504). Otherwise, outer ECC decoder 205 declares a decoding failure (step 507).

By first performing erasure decoding, error decoding need not be performed for user data that can be successfully decoded using erasure decoding. The extra operations required to perform error decoding is avoided. When the user data cannot be successfully decoded using erasure decoding, error decoding is performed. In this manner, the complexity of the overall decoding process is reduced, significantly reducing the computation power required, while maintaining the desired accuracy level.

Figure 6:
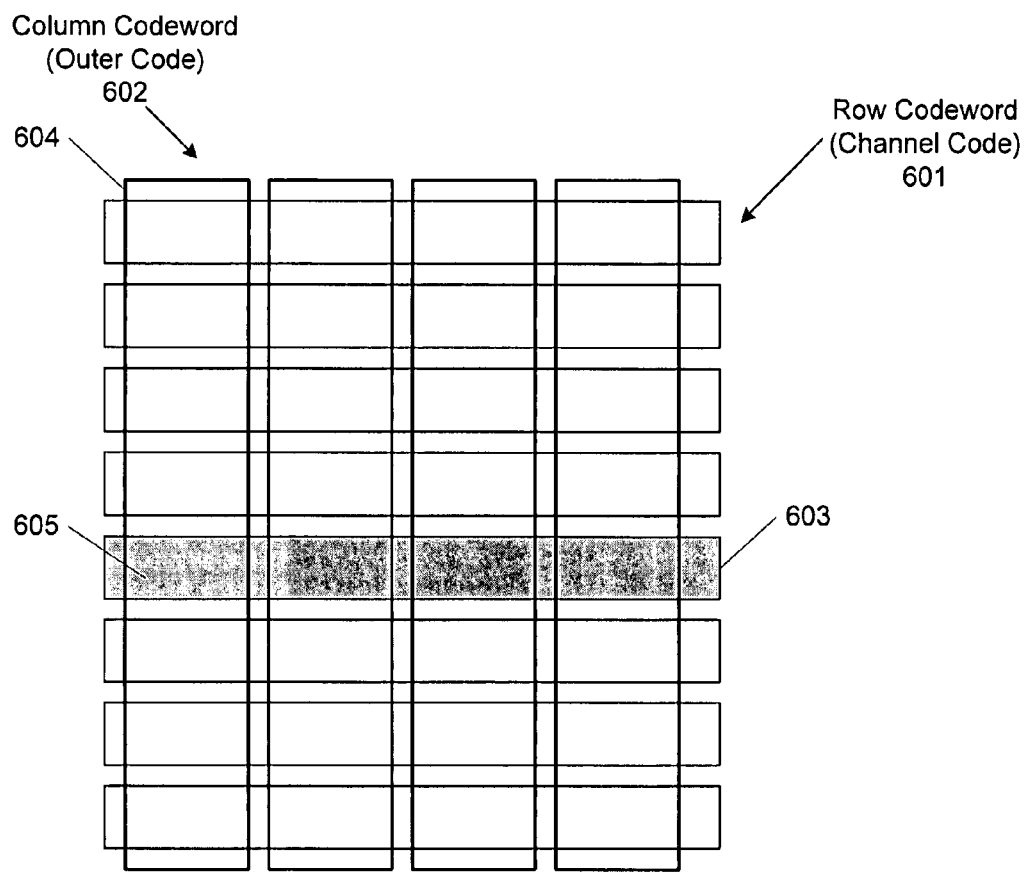
FIG. 6 is a block diagram illustrating an example of a code structure on which the decoding method is applied.

FIG. 6 is a block diagram illustrating an example of a code structure on which the decoding method is applied. The code is a product code, where the code in the column dimension is the outer code 602 encoded by the outer ECC encoder 201. The column code can be in the form of any error correction code, such as Reed-Solomon codes. The channel code 601 encoded by the channel encoder 202 is implemented in the row dimension and can be any error correction code, such as Hamming codes. The row and column dimensions in this example can be exchanged. In addition, interleaving can be applied between the row and column encoding. Reed-Solomon codes, Hamming codes, and interleaving code are known techniques in the art and will not be described in detail here.

Referring to both FIGS. 3 and 6, the channel decoder 204 receives encoded user data from the transmission channel 203 (step 301) and first decodes in the row dimension (step 302). Any row decoding failure is accompanied by setting the erasure flag to '1' to indicate erasure for all bits that belong to that row codeword (step 303). Otherwise, the erasure flag is cleared to be '0' to indicate non-erasure. In this example, assume that that erasure flag for row codeword 603 is set.

Referring to both FIGS. 5 and 6, once the channel decoder 204 completes all of the row decoding operations, the outer ECC decoder 205 receives from the channel decoder 204 the decoded bits and the associated erasure flags for the current column codeword (step 501). The outer ECC decoder 205 then performs erasure decoding (step 502). For example, the bits 605 of the row codeword 603 are part of the column codeword 604. The outer ECC decoder 205 attempts to correct these bits 605 using their associated erasure flags. If the number of erasures for the current column codeword does not exceed the erasure correction capability of the column code 602, then the erasure decoding by the outer ECC decoder 205 is successful, and the decoded user data is output (steps 503-504). Otherwise, the outer ECC decoder 205 performs error decoding (step 505). If error decoding is successful (step 506), the decoded user data is output (step 504). Otherwise, a decoding failure is declared (step 507). The decoding operation continues until all column codewords 602 are completed.

A method and system for reducing the complexity of error correction decoding while maintaining a desired performance level have been disclosed. The complexity of error correction decoding is reduced while maintaining a desired performance level through the use of concatenated error correction decoders. A channel decoder receives encoded user data from a transmission channel, decodes the bits of the user data, and generates erasure information for the decoded bits. The decoded bits and erasure information is received by an outer ECC decoder, which first performs erasure decoding. If the erasure decoding is successful, then the decoded user data is output. If the erasure decoding is not successful, then the outer ECC decoder performs the more complex but more powerful error decoding. Thus, error decoding need not be performed for user data that can be successfully decoded using erasure decoding. The extra operations required to perform error decoding is avoided. In this manner, the complexity of the overall decoding process is reduced, significantly reducing the computation power required, while maintaining the desired performance level.

The invention has been described in accordance with the embodiments shown, and one of ordinary skill in the art will readily recognize that there could be variations to the embodiments, and any variations would be within the spirit and scope of the present invention. For example, the invention can be implemented using hardware, software, a computer readable medium containing program instructions, or a combination thereof. Software written according to the invention is to be either stored in some form of computer-readable medium such as memory or CD-ROM, or is to be transmitted over a network, and is to be executed by a processor. Consequently, a computer-readable medium is intended to include a computer readable signal, which may be, for example, transmitted over a network. Accordingly, many modifications may be made by one of ordinary skill in the art without departing from the spirit and scope of the appended claims.

We claim:

1. A method for error correction decoding, comprising:
   receiving an output from a channel decoder by an outer error correction code (ECC) decoder, wherein the output comprises a plurality of decoded bits and associated erasure information;
   performing erasure decoding for the decoded bits by the outer ECC decoder using the associated erasure information; and
   if the erasure decoding is unsuccessful, then performing error decoding for the decoded bits by the outer ECC decoder.

2. The method of claim 1 further comprising:
   receiving by a channel decoder encoded user data from a transmission channel;
   decoding by the channel decoder a plurality of bits of the encoded user data; and
   generating the associated erasure information for the plurality of decoded bits.

3. The method of claim 2 wherein the encoded user data is encoded using an error correction encoding method.

4. The method of claim 2 wherein the generating comprises setting at least one erasure flag if a codeword to which a bit belongs fails decoding.

5. The method of claim 1 further comprising:
   if the erasure decoding is successful, outputting the decoded bits by the outer ECC decoder without performing the error decoding.

6. The method of claim 1 further comprising:
   if the error decoding is successful, outputting the decoded bits by the outer ECC decoder.

7. The method of claim 1 further comprising:
   if the error decoding is unsuccessful, declaring a decoding failure by the outer ECC decoder.

8. The method of claim 1 wherein in performing the error decoding, the outer ECC decoder ignores the associated erasure information.

9. An error correction decoding apparatus, comprising:
   a channel decoder for receiving encoded user data from a transmission channel, decoding a plurality of bits of the encoded user data, and generating associated erasure information for the plurality of decoded bits; and
   an outer error correction code (ECC) decoder for receiving the plurality of decoded bits and the associated erasure information, performing erasure decoding for the decoded bits using the associated erasure information, and if the erasure decoding is unsuccessful, then performing error decoding for the decoded bits.

10. The apparatus of claim 9 wherein the channel decoder sets at least one erasure flag if a codeword to which a bit belongs fails decoding.

11. The apparatus of claim 9 wherein the encoded user data is encoded using an error correction encoding method.

12. The apparatus of claim 9 wherein if the erasure decoding is successful, the outer ECC decoder outputs the decoded bits without performing the error decoding.

13. The apparatus of claim 9 wherein if the error decoding is successful, the outer ECC decoder outputs the decoded bits.

14. The apparatus of claim 9 wherein if the error decoding is unsuccessful, the outer ECC decoder declares a decoding failure.

15. The apparatus of claim 9, wherein in performing the error decoding, the outer ECC decoder ignores the associated erasure information.

16. An executable software product stored on a computer-readable medium containing program instructions for error correction decoding, the program instructions for:
   receiving an output from a channel decoder by an outer error correction code (ECC) decoder, wherein the output comprises a plurality of decoded bits and associated erasure information;
   performing erasure decoding for the decoded bits by the outer ECC decoder using the associated erasure information; and
   if the erasure decoding is unsuccessful, then performing error decoding for the decoded bits by the outer ECC decoder.

* * * * *